United States Patent

Konda et al.

[11] Patent Number: 5,902,678
[45] Date of Patent: May 11, 1999

[54] PRESSURE-SENSITIVE ADHESIVE OR PRESSURE-SENSITIVE ADHESIVE TAPE FOR FOREIGN-MATTER REMOVAL

[75] Inventors: Yukari Konda; Kazuyuki Miki, both of Osaka, Japan

[73] Assignee: Nitto Denko Corporation, Osaka, Japan

[21] Appl. No.: 08/825,638

[22] Filed: Apr. 1, 1997

[51] Int. Cl.⁶ ........................................ B32B 7/12
[52] U.S. Cl. ........................ 428/345; 428/343; 428/922
[58] Field of Search ............... 428/345, 40.1, 428/343, 354, 355 R, 355 EN, 355 AC, 356, 922

[56] References Cited

U.S. PATENT DOCUMENTS

| | | | |
|---|---|---|---|
| 5,187,007 | 2/1993 | Ebe et al. | 428/345 X |
| 5,278,199 | 1/1994 | Ohkawa et al. | 522/95 |
| 5,281,473 | 1/1994 | Ishiwata et al. | 428/345 |
| 5,304,418 | 4/1994 | Akada et al. | 428/345 |
| 5,525,422 | 6/1996 | Spies et al. | 428/345 X |
| 5,637,395 | 6/1997 | Uemura et al. | 428/345 X |

OTHER PUBLICATIONS

Jap Pat Abst JP07142440–A.

*Primary Examiner*—Daniel Zirker
*Attorney, Agent, or Firm*—Sughrue, Mion, Zinn, Macpeak & Seas, PLLC

[57] ABSTRACT

A pressure-sensitive adhesive or pressure-sensitive adhesive tape for removing a foreign matter present on the surface of an article from the article, the pressure-sensitive adhesive having the property of curing with an actinic energy source to have a three-dimensional network molecular structure, a modulus of elasticity (as measured in accordance with JIS K 7127) before the curing of lower than 1 $kg/mm^2$ and a modulus of elasticity after the curing of 1 $kg/mm^2$ or higher, and a degree of volumetric shrinkage through the curing of 2% or higher.

6 Claims, 1 Drawing Sheet

PRESSURE-SENSITIVE ADHESIVE OR PRESSURE-SENSITIVE ADHESIVE TAPE FOR FOREIGN-MATTER REMOVAL

FIELD OF THE INVENTION

The present invention relates to a pressure-sensitive adhesive or pressure-sensitive adhesive tape for foreign-matter (particle) removal which is advantageously used especially in the cleaning steps of processes for producing precision electronic parts such as semiconductors, liquid-crystal display panels, plasma display panels (PDP), hard disks, optical disks, magnetic heads, and optical parts/lenses.

BACKGROUND OF THE INVENTION

With the trends toward higher densities and higher integration degrees in LSIs and toward higher densities and larger display sizes in liquid-crystal display panels, the yields and reliability of products have come to be considerably influenced by whether the foreign matters (particles) present on the surfaces of wafers or glass substrates can be removed completely and efficiency. In the case of a semiconductor wafer, for example, the steps of film formation, resist application, exposure, development, etching, resist removal, cleaning, etc. are repeated for the formation of circuit patterns. Any foreign matter present on a semiconductor wafer on its circuit pattern side is causative of circuit breakage or short-circuiting in the formation of a next circuit. Any foreign matter present on the back side of a semiconductor wafer (the side opposite to the circuit pattern side) not only is causative of a failure of focusing in the exposure step in circuit formation, but is causative of circuit breakage or short-circuiting when transferred to the surface of the adjacent wafer.

Various techniques have hence been proposed and put to practical use in order to heighten the level of cleanliness in LSI production processes and the level of wafer cleaning techniques. In particular, the cleaning steps account for about 30% of all steps of a process, and an improvement of the cleaning steps is a key to a higher yield and higher reliability. The same applies in fields which mostly relate to photofabrication such as processes for producing liquid-crystal display panels, plasma display panels (PDP), hard disks, optical disks, magnetic heads, and optical parts/lenses and processes for producing other precision electronic parts. However, with the recent trend toward finer patterns, the problems of cleaning techniques used in prior art processes have become serious.

Cleaning techniques include wet cleaning (with ultrapure water, chemical liquids, etc.) and dry cleaning (with UV ozone, $O_2$ plasma, etc.). In general, wet cleaning is frequently used from the standpoint of a good balance between cleaning ability and economy. A problem of wet cleaning is the re-adhesion of a foreign matter (particles) once removed by cleaning. In particular, any foreign matter adherent to the back surface of a wafer (on the side opposite to the circuit pattern side) is a potent contaminant. Another problem is pollution in a drying step, which is necessary for wet cleaning.

Attention is focused on techniques of smoothing wafer surfaces for heightening the degree of integration in semiconductors. Among such techniques is CMP (chemical mechanical polishing), which has been put to practical use. In the CMP of wafers, since a slurry of an abrasive material is used, abrasive particles and polishing dust particles adhere to the wafers in large amounts. These adherent particles should be removed, which procedure is currently being conducted by wet cleaning.

Dry cleaning (with UV ozone, $O_2$ plasma, etc.) is coming to be increasingly employed as a cleaning technique which mitigates or eliminates the drawbacks of wet cleaning. Although dry cleaning has advantages of the diminution of foreign-matter re-adhesion and no need of a drying step, it was found that the ability of dry cleaning to remove foreign matters (particles) is insufficient. In order to eliminate these problems, methods for foreign-matter removal with a pressure-sensitive adhesive or pressure-sensitive adhesive tape were proposed.

The foreign-matter removal with a pressure-sensitive adhesive is a technique which comprises applying a solution of a pressure-sensitive adhesive to a surface having a foreign matter adherent thereto, drying the solution, and then stripping the pressure-sensitive adhesive to thereby bond the adherent foreign matter to the pressure-sensitive adhesive surface and remove the same.

The foreign-matter removal with a pressure-sensitive adhesive tape is a technique which comprises applying a pressure-sensitive adhesive tape comprising a substrate and a pressure-sensitive adhesive layer to a surface having a foreign matter adherent thereto and then stripping the tape to thereby bond the adherent foreign matter to the surface of the pressure-sensitive adhesive layer of the tape and remove the same. Advantages of the foreign-matter removal with a pressure-sensitive adhesive or pressure-sensitive adhesive tape are that it is free from the problems of the ordinary techniques for foreign-matter removal described above, and that removal of a foreign matter (particles) by dry cleaning is possible.

Methods for removing an adherent foreign matter from the surface of a silicon wafer or glass substrate using the technique described above are proposed in, e.g., JP-A-48-35771, JP-A-53-92665, and JP-A-1-135574. (The term "JP-A" as used herein means an "unexamined published Japanese patent application.") Since these proposed methods are a kind of dry cleaning, the problem of foreign-matter re-adhesion in wet cleaning and the problem of pollution in a drying step can be avoided. In addition, the proposed methods are expected to have the higher ability to remove foreign matters as compared with other dry cleaning techniques using UV ozone, $O_2$ plasma, etc.

However, the methods proposed in the references cited above have problems that when the pressure-sensitive adhesive used is susceptible to plastic deformation and has high adhesive force, in stripping the pressure-sensitive adhesive or pressure-sensitive adhesive tape, there are some problems in handling properties and wafer breakage. In order to avoid these problems, JP-A-7-142440 proposes a method which comprises applying a pressure-sensitive adhesive tape employing a pressure-sensitive adhesive which cures upon ultraviolet irradiation, irradiating the tape with ultraviolet to reduce the adhesive force of the pressure-sensitive adhesive, and then stripping the tape. This prior art method has a drawback that if the pressure-sensitive adhesive used is hard and has low adhesive force, it is difficult to sufficiently bond and fix a foreign matter to the surface of the pressure-sensitive adhesive. Another drawback thereof is that the application and stripping of the pressure-sensitive adhesive tape may result in static buildup, which leads to the electrostatic breakdown of the semiconductor wafer. An effective measure against static buildup in production processes is indispensable especially to CCDs (charge coupled devices) because CCDs have a lower electrostatic withstand voltage than general MOSs and LSIs. Moreover, there is a possibility that the static buildup might cause adhesion of suspended particles and re-adhesion of a foreign matter, namely the pressure-sensitive adhesive tape itself might be a pollution source.

SUMMARY OF THE INVENTION

Under these circumstances, an object of the present invention is to remove a foreign matter to a high degree by a dry cleaning technique using a specific pressure-sensitive adhesive or pressure-sensitive adhesive tape which method is more useful than wet cleaning techniques.

As a result of intensive studies made by the present inventors, it has been found that an adherent foreign matter can be effectively bonded and fixed to a pressure-sensitive adhesive when the pressure-sensitive adhesive used is of the type curing with an actinic energy source, has a modulus of elasticity (tensile modulus of elasticity as measured in accordance with JIS K 7127) before the curing of lower than 1 kg/mm$^2$, preferably from 0.01 to 0.8 kg/mm$^2$ and a modulus of elasticity (as measured in accordance with JIS K 7127) after the curing of 1 kg/mm$^2$ or higher, preferably from 2 to 100 kg/mm$^2$, and has a degree of volumetric shrinkage through the curing of 2% or higher, preferably from 2 to 10%. It has also been found that when the pressure-sensitive adhesive is cured with an actinic energy source and then stripped, not only the stripping is easy due to the reduced adhesive force thereof, but also the pressure-sensitive adhesive is capable of sufficiently holding the foreign matter because of the volumetric shrinkage of the adhesive, whereby the problems of adhered damage and contamination by an adhesive residue are mitigated. To sum up, the present inventors have found that a foreign matter can be easily removed to a high degree with the pressure-sensitive adhesive or pressure-sensitive adhesive tape described above while avoiding the problems described hereinabove. The present invention has been completed based on this finding.

When the above-described pressure-sensitive adhesive tape of the present invention employs a substrate which has undergone an antistatic treatment so that the treated surface has a surface resistivity of 1×10$^{12}$ (Ω/square) or lower, the pressure-sensitive adhesive tape can be prevented from causing static buildup upon application or stripping, whereby electrostatic breakdown of semiconductor wafers, adhesion of suspended particles, and re-adhesion of the once removed foreign matter can be avoided.

DETAILED DESCRIPTION OF THE INVENTION

Figure 1:
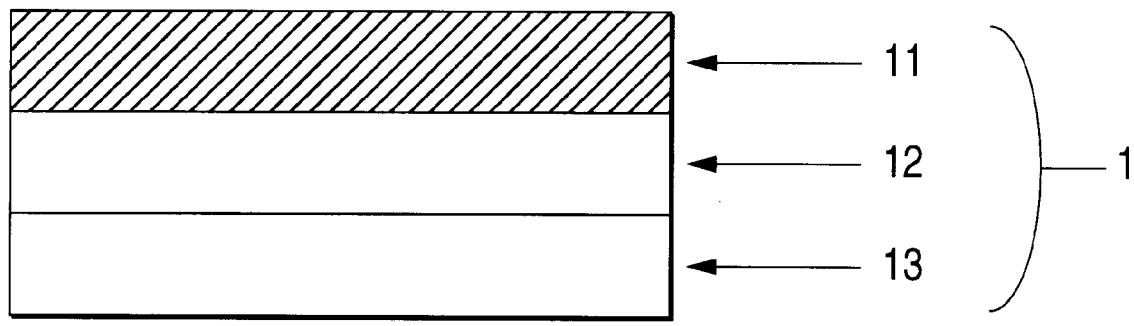
FIG. 1 is a sectional view of one embodiment of the pressure-sensitive adhesive tape for foreign-matter removal according to the present invention. This pressure-sensitive adhesive tape 1 consists of a substrate 11 which has undergone an antistatic treatment, a pressure-sensitive adhesive layer 12 formed thereon, and a separator 13 superposed on the layer 12.
Figure 2:
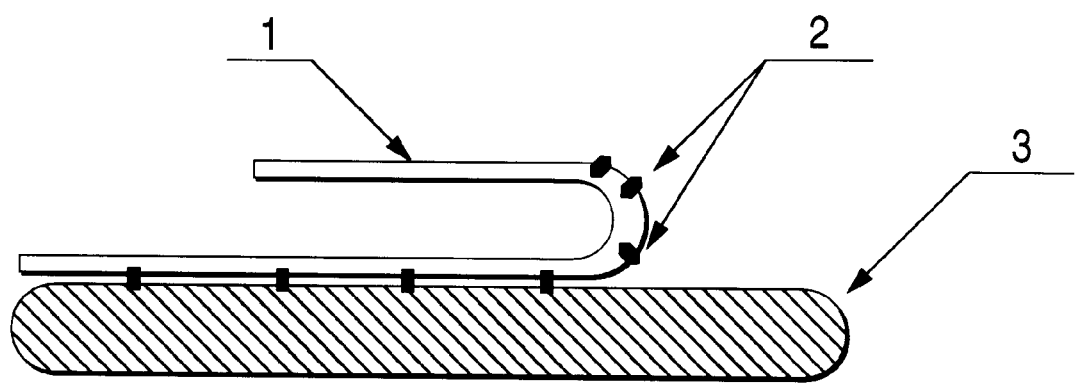
FIG. 2 illustrates a method for a foreign-matter removal according to the present invention. Numeral 1 indicates a pressure-sensitive adhesive tape, numeral 2 indicates foreign matters, and numeral 3 indicates a semiconductor wafer.

Examples of the substrate include sheets having a thickness of from 10 to 1,000 μm and made of a plastic. Examples of the plastic include polypropylene, polyesters, polycarbonates, polyethylene, ethylene/vinyl acetate copolymers, ethylene/ethyl acrylate copolymers, ethylene/propylene copolymers, and poly(vinyl chloride). The substrate is preferably made of a material which sufficiently transmits an actinic energy source, and preferably has a constitution suitable for the transmission thereof.

An antistatic layer which the substrate can optionally have may be formed, for example, by applying an antistatic agent to the substrate surface, by vapor-depositing a conductive substance on the substrate surface, by incorporating an antistatic agent into a substrate material through compounding, or by using a substrate being electrically conductive. A suitable method may be selected according to need. Examples of the antistatic agent used here include surfactants, conductive organic substances (e.g., carbon black and organic semiconductors), metals, and metal oxides. The treated surface preferably has a surface resistivity of 1×10$^{12}$ (Ω/square) or lower, more preferably from 1×10$^5$ to 1×10$^{10}$ (Ω/square). The test method according to ASTM D257 is used for the determination of surface resistivity.

The pressure-sensitive adhesive of the present invention has the property of curing with an actinic energy source to have a three-dimensional network molecular structure, and is regulated so as to have a modulus of elasticity (as measured in accordance with JIS K 7127) of lower than 1 kg/mm$^2$, preferably from 0.01 to 0.8 kg/mm$^2$ before curing and to come to have a modulus of elasticity of 1 kg/mm$^2$ or higher, preferably from 2 to 100 kg/mm$^2$ upon curing by the action of an actinic energy source. The reason for regulating the modulus of elasticity of the uncured pressure-sensitive adhesive to lower than 1 kg/mm$^2$, preferably from 0.01 to 0.8 kg/mm$^2$, is that the pressure-sensitive adhesive having a modulus of elasticity within this range is capable of coming into close contact with a foreign matter when a layer of the pressure-sensitive adhesive is formed or a pressure-sensitive adhesive tape is applied. The reason for regulating the modulus of elasticity of the pressure-sensitive adhesive which has cured by the action of an actinic energy source to 1 kg/mm$^2$ or higher, preferably from 2 to 100 kg/mm$^2$, is that the foreign matter bonded to the pressure-sensitive adhesive having a modulus of elasticity within this range can be fixed thereto without fail. If the modulus of elasticity thereof exceeds 100 kg/mm$^2$, there is the possibility that the adhesive layer might become so brittle as to suffer a cohesive failure depending on the size of the foreign matter to be removed.

The pressure-sensitive adhesive should be further regulated so as to have a degree of volumetric shrinkage through curing of 2% or higher, preferably from 2 to 10%. The reasons for regulating the degree of volumetric shrinkage of the pressure-sensitive adhesive through curing to 2% or higher, preferably from 2 to 10%, are that volumetric shrinkage enables the pressure-sensitive adhesive to sufficiently hold a foreign matter, and that degrees of volumetric shrinkage exceeding 10% may result in tape warpage and in the breakage of the substrate due to the volumetric shrinkage of the pressure-sensitive adhesive when the substrate is a fragile one such as a semiconductor wafer or glass substrate.

The degree of volumetric shrinkage can be obtained as follows. A pressure-sensitive adhesive layer is evaluated for specific gravity before and after curing. For instance, the layers before and after curing each are cut into a piece of 3×3 cm square and then evaluated for specific gravity by means of an electronic densitometer which provides a specific gravity of a sample by comparing the weight of the sample in air with that in water. The degree of volumetric shrinkage is obtained according to the following equation:

Degree of Volumetric Shrinkage=$(1-\rho_0/\rho_1)\times 100$ (%)

$\rho_0$ is the specific gravity of the pressure-sensitive adhesive layer before curing, and $\rho_1$ is the specific gravity of the pressure-sensitive adhesive layer after curing.

The term "active energy source" herein means an electromagnetic wave represented by ultraviolet rays, infrared rays, electron rays, X-rays, or the like or an elastic wave represented by ultrasonic wave or the like.

There are no particular limitations on the formation of a pressure-sensitive adhesive layer according to the present invention, as long as the specific properties described above can be designed. Examples of usable pressure-sensitive adhesives include those based on acrylic resins, silicone resins, fluororesins, and rubbers. A polymerizable monomer or oligomer having, for example, at least two carbon-carbon double bonds per molecule and a polymerization initiator which generates a free radical by the action of an actinic energy source are incorporated into such a pressure-sensitive adhesive. The above pressure-sensitive adhesive is obtained by compounding a base polymer selected from various polymers such as acrylic resins, silicone resins, fluororesins, and rubbers (natural and synthetic rubbers) with a suitable crosslinking agent to crosslink the base polymer.

The polymerizable monomer or oligomer preferably has at least two, more preferably from three to six carbon-carbon double bonds per molecule. Examples of the polymerizable monomer or oligomer include commercial oligoester acrylates, urethane acrylates, and epoxy acrylates, such as tetramethylolmethane tetraacrylate, pentaerythritol triacrylate, pentaerythritol pentaacrylate, dipentaerythritol monohydroxypentaacrylate, dipentaerythritol hexaacrylate, 1,4-butanediol diacrylate, polyethylene glycol diacrylate, and polyethylene glycol dimethacrylate. These polymerizable compounds may be used alone or in combination of two or more thereof. The use amount thereof is generally from 20 to 500 parts by weight, preferably from 50 to 200 parts by weight, per 100 parts by weight of the base polymer. The reasons for this are that use of a polymerizable compound in such amounts enables a foreign matter to be effectively removed, and that it enables the pressure-sensitive adhesive to have moduli of elasticity and a degree of volumetric shrinkage within the respective ranges specified above.

Any polymerization initiator may be used as long as it is capable of generating a free radial by the action of an actinic energy source. An appropriate initiator is suitably selected according to the kind of the actinic energy source to be used. Examples thereof include isopropyl benzoin ether, isobutyl benzoin ether, benzophenone, chlorothioxanthone, dodecylthioxanthone, dimethylthioxanthone, diethylthioxanthone, acetophenone diethyl ketal, benzyl dimethyl ketal, α-hydroxycyclohexyl phenyl ketone, 2-hydroxymethylphenylpropane, benzoyl peroxide, and azobisisobutyronitrile. These compounds may be used alone or in combination of two or more thereof. The use amount thereof is preferably from 0.1 to 30 parts by weight per 100 parts by weight of the polymerizable compound. If desired, the polymerization initiator may be used in combination with an amine compound such as triethylamine, tetraethylpentamine, or dimethylaminoethanol as a polymerization accelerator.

The pressure-sensitive adhesive layer 12 having the composition described above can be formed by applying a pressure-sensitive adhesive composition comprising the ingredients described above, i.e., a base polymer, a polymerizable monomer or oligomer, and a polymerization initiator, to a substrate 11 and then conducting a crosslinking treatment by heating or other means. It is also possible to form the pressure-sensitive adhesive layer 12 on a separator 13 by the same method as described above and then transfer the layer 12 to a substrate 11. Although the pressure-sensitive adhesive layer 12 may have any suitable thickness, the thickness thereof is generally from 5 to 100 μm. For carrying out the crosslinking treatment, which is performed if desired, a polyfunctional compound having functional groups reactive with the functional groups of the base polymer is incorporated beforehand as a crosslinking agent into the pressure-sensitive adhesive composition. For example, in the case of a pressure-sensitive adhesive comprising as the base polymer an acrylic resin having crosslinkable functional groups in the molecule, a polyisocyanate compound, a polyepoxy compound, or the like is incorporated as a crosslinking agent.

The adhesive force of the pressure-sensitive adhesive layer 12 having the composition described above is usually 500 g/20 mm or higher, preferably from 700 to 2,000 g/20 mm, in terms of adhesion to a silicon wafer (mirror surface) (ordinary temperature (23° C.); 180° peeling method; peel rate, 300 mm/min, in accordance with JIS Z 0237). The adhesive force thereof after curing with an actinic energy source is usually 500 g/20 mm or lower, preferably from 1 to 100 g/20 mm.

The separator 13 serves to protect the surface of the pressure-sensitive adhesive layer 12 against contamination during the storage, transportation, etc. of the pressure-sensitive adhesive tape 1, and is stripped off when the tape 1 is applied. This separator 13 is usually a flexible sheet which comprises paper (dust-free paper), a plastic film, a metal foil, or the like, and which optionally has releasability imparted thereto through a surface treatment with a release agent.

In the method of the present invention, the pressure-sensitive adhesive tape or pressure-sensitive adhesive of the present invention having the constitution described above is used for removing a foreign matter adherent to the surface of an article as follows. First, the pressure-sensitive adhesive tape or the pressure-sensitive adhesive is applied to the whole surface of the article from which a foreign matter is to be removed, and the pressure-sensitive adhesive layer surface is brought into close contact with the foreign matter. In the case of using the pressure-sensitive adhesive tape, the desired close contact can be accomplished, for example, by pressing the applied pressure-sensitive adhesive tape with a hand roller and then allowing the tape to stand for about several minutes. Since the pressure-sensitive adhesive layer is plastically deformable and has a high adhesive force within the range as specified above, it effectively adheres to and hold the foreign matter on the article upon the application operation.

Before the pressure-sensitive adhesive tape thus applied is stripped by peeling an end thereof, an actinic energy source such as, e.g., ultraviolet rays is supplied to the tape from the substrate side. The pressure-sensitive adhesive layer thus cures to have a three-dimensional network molecular structure and an increased modulus of elasticity. As a result, the pressure-sensitive adhesive layer becomes hard and comes to have a low adhesive force within the range specified above. The pressure-sensitive adhesive tape in which the pressure-sensitive adhesive layer is in the above-described state can be stripped extremely smoothly almost without damaging the surface of the article or leaving an adhesive residue which contaminates the surface. In addition, due to the curing, the foreign matter present on the article surface is tenaciously adhered to the pressure-sensitive adhesive layer surface without fail. The application and stripping of the pressure-sensitive adhesive tape do not result in static buildup, and hence cause neither electrostatic breakdown, adhesion of suspended particles, nor re-adhesion of the once-removed foreign matter. As a result, foreign-matter removal can be conducted in a higher degree than wet cleaning and than the removal with any of the pressure-sensitive adhesive tapes proposed so far, not to mention than the conventional dry cleaning. This high-degree of foreign-matter removal is effective in diminishing the occurrence of circuit breakage, short-circuiting, or exposure failure in circuit formation to thereby greatly improve the yield and reliability of the final product. Use of the pressure-sensitive adhesive or pressure-sensitive adhesive tape of the present invention for cleaning in place of the conventional wet or dry cleaning, in which pure water, chemicals, air, electrical power, or the like is consumed in a large quantity, greatly contributes to the preservation of the earthly environment.

Although the fields to which the pressure-sensitive adhesive or pressure-sensitive adhesive tape for foreign-matter removal of the present invention is applied are not particularly limited, the adhesive or tape is especially suitable for use in, e.g., the cleaning steps of processes for producing precision electronic parts such as semiconductor wafers, liquid-crystal display panels, plasma display panels (PDP), hard disks, optical disks, magnetic heads, and optical parts/lenses.

The pressure-sensitive adhesive or pressure-sensitive adhesive tape for foreign-matter removal of the present invention brings about the following effects. The adhesive or tape is capable of easily removing, to a high degree, foreign matters adherent to the surfaces of articles such as, in particular, precision electronic parts without posing problems such as damaging the articles and leaving an adhesive residue to cause contamination. Thus, use of the pressure-sensitive adhesive or pressure-sensitive adhesive tape greatly improves the yields and reliability of articles such as precision electronic parts. Furthermore, the adhesive or tape contributes to the preservation of the earthly environment as compared with the conventional cleaning techniques of other types.

The present invention will be explained below in more detail by reference to Examples thereof, but the invention should not be construed as being limited to these Examples.

EXAMPLE 1

Eighty parts by weight of butyl acrylate was copolymerized with 20 parts by weight of 2-ethylhexyl acrylate and 5 parts by weight of acrylic acid in ethyl acetate in an ordinary way to obtain an acrylic copolymer having a number-average molecular weight (hereinafter referred to simply as "molecular weight") of 750,000. To 100 parts by weight of this copolymer were added 3 parts by weight of a polyisocyanate compound as a crosslinking agent, 100 parts by weight of polyethylene glycol diacrylate (molecular weight, 308) as a polymerizable oligomer, and 3 parts by weight of benzyl dimethyl ketal as a photopolymerization initiator. A polyester substrate sheet having a thickness of 50 µm which had undergone a corona discharge treatment was coated on the treated side with the acrylic pressure-sensitive adhesive solution prepared above, and the coating was heated at 120° C. for 5 minutes to conduct crosslinking. Thus, a pressure-sensitive adhesive tape having a 20 µm-thick pressure-sensitive adhesive layer was obtained.

The adhesive force of the pressure-sensitive adhesive layer of the thus-obtained pressure-sensitive adhesive tape was measured with respect to adhesion to a silicon wafer (mirror surface) (ordinary temperature (23° C.); 180° peeling method; peel rate, 300 mm/min; sample width, 20 mm; in accordance with JIS Z 0237), and was found to be 950 g/20 mm. Further, the pressure-sensitive adhesive tape applied was irradiated with ultraviolet (wavelength, 365 nm; 1,000 mJ/cm$^2$) from the back side thereof. Immediately after the irradiation, the tape was stripped to measure the adhesive force thereof in the same manner. As a result, the adhesive force of the thus-treated tape was found to be 20 g/20 mm.

A polyester film having a thickness of 50 µm which had undergone a treatment for imparting releasability was coated on the treated side with the pressure-sensitive adhesive solution described above to form a pressure-sensitive adhesive layer having a thickness of 20 µm. This coated polyester film was cut into a dumbbell shape. After the pressure-sensitive adhesive layer was separated from the releasable polyester film, the tensile modulus of elasticity of the pressure-sensitive adhesive layer alone was measured in accordance with JIS K 7127 and was found to be 0.5 kg/mm$^2$. Further, the pressure-sensitive adhesive layer was irradiated with ultraviolet (wavelength, 365 nm; 1,000 mJ/cm$^2$), and was then examined for tensile modulus of elasticity in the same manner. As a result, the tensile modulus of elasticity of the thus-treated pressure-sensitive adhesive layer was found to be 75 kg/mm$^2$.

A pressure-sensitive adhesive layer formed by the same method was examined for specific gravity. This pressure-sensitive adhesive layer was irradiated with ultraviolet (wavelength, 365 nm; 1,000 mJ/cm$^2$) and then examined for specific gravity in the same manner. The degree of volumetric shrinkage of the pressure-sensitive adhesive layer was calculated from the resulting change in specific gravity through ultraviolet irradiation, and was found to be 5%.

Five-inch silicon wafers (mirror wafers with no circuit pattern) having no foreign particles of 0.2 µm or larger were passed through a given step (CVD step) to allow foreign particles to adhere thereto, and the number of 0.2 µm or larger foreign particles which thus adhered to the mirror surface of each silicon wafer was counted with a laser surface inspection apparatus (Surfscan-6200, manufactured by Tencor Instruments). For the purpose of counting the number of foreign particles adhering to the front and back sides of individual wafers, the same inspection was conducted with respect to both sides by passing one wafer through the step such that the mirror surface was the face and passing the other wafer through the step such that the mirror surface was the back.

A cleaning test was conducted as follows. The pressure-sensitive adhesive tape produced by the method described above was applied with a hand roller (elastic rubber roller) to the mirror surface of a silicon wafer to which foreign particles had been adhered as described above. The pressure-sensitive adhesive tape applied was allowed to stand for 3 minutes and then stripped (stripping rate, 10 mm/sec) to conduct a cleaning operation. After this cleaning operation, the number of foreign particles of 0.2 µm or larger adherent to the mirror surface was counted again with the laser surface inspection apparatus. With respect to each of the front and back sides of the silicon wafer, the percentage removal of foreign particles was calculated from the number of foreign particles which adhered to the surface and the number of foreign particles remaining adherent thereto after the application and stripping of the pressure-sensitive adhesive tape.

The pressure-sensitive adhesive tape obtained above was applied with a hand roller to the mirror surface of a 5-inch silicon wafer (mirror wafer with no circuit pattern) having no foreign particles of 2 μm or larger. The pressure-sensitive adhesive tape applied was allowed to stand for 3 minutes and then stripped. The number of foreign particles (size, 2 μm or larger) which adhered to the mirror surface was counted with the laser surface inspection apparatus. Thus, a test for examining contamination by the adhesive (adhesive contamination test) was conducted.

The series of procedures described above was carried out in a class-10 clean room (temperature, 23° C.; humidity, 60%).

EXAMPLE 2

A pressure-sensitive adhesive tape having a 20 μm-thick pressure-sensitive adhesive layer was obtained in the same manner as in Example 1, except that 100 parts by weight of polyethylene glycol diacrylate (molecular weight, 508) was used as a polymerizable oligomer.

The adhesive force of the pressure-sensitive adhesive layer of the thus-obtained pressure-sensitive adhesive tape was measured with respect to adhesion to a silicon wafer (mirror surface) (ordinary temperature (23° C.); 180° peeling method; peel rate, 300 mm/min; sample width, 20 mm; in accordance with JIS Z 0237), and was found to be 1,100 g/20 mm. Further, the pressure-sensitive adhesive tape applied was irradiated with ultraviolet (wavelength, 365 nm; 1,000 mJ/cm$^2$) from the back side thereof. Immediately after the irradiation, the tape was stripped to measure the adhesive force thereof in the same manner. As a result, the adhesive force of the thus-treated tape was found to be 22 g/20 mm.

A polyester film having a thickness of 50 μm which had undergone a treatment for imparting releasability was coated on the treated side with the pressure-sensitive adhesive solution described above to form a pressure-sensitive adhesive layer having a thickness of 20 μm. This coated polyester film was cut into a dumbbell shape. After the pressure-sensitive adhesive layer was separated from the releasable polyester film, the tensile modulus of elasticity of the pressure-sensitive adhesive layer alone was measured in accordance with JIS K 7127 and was found to be 0.7 kg/mm$^2$. Further, the pressure-sensitive adhesive layer was irradiated with ultraviolet (wavelength, 365 nm; 1,000 mJ/cm$^2$), and was then examined for tensile modulus of elasticity in the same manner. As a result, the tensile modulus of elasticity of the thus-treated pressure-sensitive adhesive layer was found to be 10 kg/mm$^2$. The degree of volumetric shrinkage of the pressure-sensitive adhesive layer was calculated from the change in specific gravity caused by ultraviolet irradiation, and was found to be 3%.

Further, the percentage removal of foreign particles and the number of foreign particles adhered were determined in the same manner as in Example 1.

EXAMPLE 3

A pressure-sensitive adhesive tape having a 20 μm-thick pressure-sensitive adhesive layer was obtained in the same manner as in Example 1, except that 100 parts by weight of polyethylene glycol diacrylate (molecular weight, 708) was used as a polymerizable oligomer.

The adhesive force of the pressure-sensitive adhesive layer of the thus-obtained pressure-sensitive adhesive tape was measured with respect to adhesion to a silicon wafer (mirror surface) (ordinary temperature (23° C.); 180° peeling method; peel rate, 300 mm/min; sample width, 20 mm; in accordance with JIS Z 0237), and was found to be 1,230 g/20 mm. Further, the pressure-sensitive adhesive tape applied was irradiated with ultraviolet (wavelength, 365 nm; 1,000 mJ/cm$^2$) from the back side thereof. Immediately after the irradiation, the tape was stripped to measure the adhesive force thereof in the same manner. As a result, the adhesive force of the thus-treated tape was found to be 70 g/20 mm.

A polyester film having a thickness of 50 μm which had undergone a treatment for imparting releasability was coated on the treated side with the pressure-sensitive adhesive solution described above to form a pressure-sensitive adhesive layer having a thickness of 20 μm. This coated polyester film was cut into a dumbbell shape. After the pressure-sensitive adhesive layer was separated from the releasable polyester film, the tensile modulus of elasticity of the pressure-sensitive adhesive layer alone was measured in accordance with JIS K 7127 and was found to be 0.8 kg/mm$^2$. Further, the pressure-sensitive adhesive layer was irradiated with ultraviolet (wavelength, 365 nm; 1,000 mJ/cm$^2$), and was then examined for tensile modulus of elasticity in the same manner. As a result, the tensile modulus of elasticity of the thus-treated pressure-sensitive adhesive layer was found to be 2.0 kg/mm$^2$. The degree of volumetric shrinkage of the pressure-sensitive adhesive layer was calculated from the change in specific gravity caused by ultraviolet irradiation, and was found to be 2%.

Further, the percentage removal of foreign particles and the number of foreign particles adhered were determined in the same manner as in Example 1.

EXAMPLE 4

A pressure-sensitive adhesive tape having a 20 μm-thick pressure-sensitive adhesive layer was obtained in the same manner as in Example 1, except that a polyester substrate sheet having a thickness of 50 μm which had undergone an antistatic treatment was used.

In the antistatic treatment, the polyester substrate sheet was coated on the side opposite to the side where a pressure-sensitive adhesive layer was to be formed, with a liquid prepared by diluting Colcoat NR-121X (manufactured by Colcoat Co., Ltd., Japan) with methyl ethyl ketone 10 times, by means of a bar coater. The treated surface had a surface resistivity of $2 \times 10^9$ (Ω/square) (as measured in accordance with ASTM D257).

The adhesive force of the pressure-sensitive adhesive layer of the thus-obtained pressure-sensitive adhesive tape was measured with respect to adhesion to a silicon wafer (mirror surface) (ordinary temperature (23° C.); 180° peeling method; peel rate, 300 mm/min; sample width, 20 mm; in accordance with JIS Z 0237), and was found to be 950 g/20 mm. Further, the pressure-sensitive adhesive tape applied was irradiated with ultraviolet (wavelength, 365 nm; 1,000 mJ/cm$^2$) from the back side thereof. Immediately after the irradiation, the tape was stripped to measure the adhesive force thereof in the same manner. As a result, the adhesive force of the thus-treated tape was found to be 20 g/20 mm.

A polyester film having a thickness of 50 μm which had undergone a treatment for imparting releasability was coated on the treated side with the pressure-sensitive adhesive solution described above to form a pressure-sensitive adhesive layer having a thickness of 20 μm. This coated polyester film was cut into a dumbbell shape. After the pressure-sensitive adhesive layer was separated from the releasable polyester film, the tensile modulus of elasticity of the pressure-sensitive adhesive layer alone was measured in accordance with JIS K 7127 and was found to be 0.5 kg/mm$^2$. Further, the pressure-sensitive adhesive layer was irradiated with ultraviolet (wavelength, 365 nm; 1,000 mJ/cm$^2$), and was then examined for tensile modulus of elasticity in the same manner. As a result, the tensile modulus of elasticity of the thus-treated pressure-sensitive adhesive layer was found to be 75 kg/mm$^2$. The degree of volumetric shrinkage of the pressure-sensitive adhesive layer was calculated from the change in specific gravity caused by ultraviolet irradiation, and was found to be 2%.

Further, the percentage removal of foreign particles and the number of foreign particles adhered were determined in the same manner as in Example 1.

COMPARATIVE EXAMPLE 1

A pressure-sensitive adhesive tape having a 20 μm-thick pressure-sensitive adhesive layer was obtained in the same manner as in Example 1, except that 100 parts by weight of polyethylene glycol dimethacrylate (molecular weight, 1,136) was used as a polymerizable oligomer.

The adhesive force of the pressure-sensitive adhesive layer of the thus-obtained pressure-sensitive adhesive tape was measured with respect to adhesion to a silicon wafer (mirror surface) (ordinary temperature (23° C.); 180° peeling method; peel rate, 300 mm/min; sample width, 20 mm; in accordance with JIS Z 0237), and was found to be 1,400 g/20 mm. Further, the pressure-sensitive adhesive tape applied was irradiated with ultraviolet (wavelength, 365 nm; 1,000 mJ/cm$^2$) from the back side thereof. Immediately after the irradiation, the tape was stripped to measure the adhesive force thereof in the same manner. As a result, the adhesive force of the thus-treated tape was found to be 465 g/20 mm.

A polyester film having a thickness of 50 μm which had undergone a treatment for imparting releasability was coated on the treated side with the pressure-sensitive adhesive solution described above to form a pressure-sensitive adhesive layer having a thickness of 20 μm. This coated polyester film was cut into a dumbbell shape. After the pressure-sensitive adhesive layer was separated from the releasable polyester film, the tensile modulus of elasticity of the pressure-sensitive adhesive layer alone was measured in accordance with JIS K 7127 and was found to be 0.3 kg/mm$^2$. Further, the pressure-sensitive adhesive layer was irradiated with ultraviolet (wavelength, 365 nm; 1,000 mJ/cm$^2$), and was then examined for tensile modulus of elasticity in the same manner. As a result, the tensile modulus of elasticity of the thus-treated pressure-sensitive adhesive layer was found to be 0.9 kg/mm$^2$. The degree of volumetric shrinkage of the pressure-sensitive adhesive layer was calculated from the change in specific gravity caused by ultraviolet irradiation, and was found to be 1%.

Further, the percentage removal of foreign particles and the number of foreign particles adhered were determined in the same manner as in Example 1.

COMPARATIVE EXAMPLE 2

A pressure-sensitive adhesive tape having a 20 μm-thick pressure-sensitive adhesive layer was obtained in the same manner as in Example 1, except that 100 parts by weight of ethylene glycol dimethacrylate (molecular weight, 198) was used as a polymerizable oligomer.

The adhesive force of the pressure-sensitive adhesive layer of the thus-obtained pressure-sensitive adhesive tape was measured with respect to adhesion to a silicon wafer (mirror surface) (ordinary temperature (23° C.); 180° peeling method; peel rate, 300 mm/min; sample width, 20 mm; in accordance with JIS Z 0237), and was found to be 880 g/20 mm. Further, the pressure-sensitive adhesive tape applied was irradiated with ultraviolet (wavelength, 365 nm; 1,000 mJ/cm$^2$) from the back side thereof. Immediately after the irradiation, the tape was stripped to measure the adhesive force thereof in the same manner. As a result, the adhesive force of the thus-treated tape was found to be 9 g/20 mm.

A polyester film having a thickness of 50 μm which had undergone a treatment for imparting releasability was coated on the treated side with the pressure-sensitive adhesive solution described above to form a pressure-sensitive adhesive layer having a thickness of 20 μm. This coated polyester film was cut into a dumbbell shape. After the pressure-sensitive adhesive layer was separated from the releasable polyester film, the tensile modulus of elasticity of the pressure-sensitive adhesive layer alone was measured in accordance with JIS K 7127 and was found to be 1.5 kg/mm$^2$. Further, the pressure-sensitive adhesive layer was irradiated with ultraviolet (wavelength, 365 nm; 1,000 mJ/cm$^2$), and was then examined for tensile modulus of elasticity in the same manner. As a result, the tensile modulus of elasticity of the thus-treated pressure-sensitive adhesive layer was found to be 80 kg/mm$^2$. The degree of volumetric shrinkage of the pressure-sensitive adhesive layer was calculated from the change in specific gravity caused by ultraviolet irradiation, and was found to be 4%.

Further, the percentage removal of foreign particles and the number of foreign particles adhered were determined in the same manner as in Example 1.

COMPARATIVE EXAMPLE 3

A pressure-sensitive adhesive tape having a 20 μm-thick pressure-sensitive adhesive layer was obtained in the same manner as in Example 1, except that 100 parts by weight of polyethylene glycol dimethacrylate (molecular weight, 736) was used as a polymerizable oligomer.

The adhesive force of the pressure-sensitive adhesive layer of the thus-obtained pressure-sensitive adhesive tape was measured with respect to adhesion to a silicon wafer (mirror surface) (ordinary temperature (23° C.); 180° peeling method; peel rate, 300 mm/min; sample width, 20 mm; in accordance with JIS Z 0237), and was found to be 1,040 g/20 mm. Further, the pressure-sensitive adhesive tape applied was irradiated with ultraviolet (wavelength, 365 nm; 1,000 mJ/cm$^2$) from the back side thereof. Immediately after the irradiation, the tape was stripped to measure the adhesive force thereof in the same manner. As a result, the adhesive force of the thus-treated tape was found to be 80 g/20 mm.

A polyester film having a thickness of 50 μm which had undergone a treatment for imparting releasability was coated on the treated side with the pressure-sensitive adhesive solution described above to form a pressure-sensitive adhesive layer having a thickness of 20 μm. This coated polyester film was cut into a dumbbell shape. After the pressure-sensitive adhesive layer was separated from the releasable polyester film, the tensile modulus of elasticity of the pressure-sensitive adhesive layer alone was measured in accordance with JIS K 7127 and was found to be 0.5 kg/mm$^2$. Further, the pressure-sensitive adhesive layer was irradiated with ultraviolet (wavelength, 365 nm; 1,000 mJ/cm$^2$), and was then examined for tensile modulus of elasticity in the same manner. As a result, the tensile modulus of elasticity of the thus-treated pressure-sensitive adhesive layer was found to be 5.0 kg/mm$^2$. The degree of volumetric shrinkage of the pressure-sensitive adhesive layer was calculated from the change in specific gravity caused by ultraviolet irradiation, and was found to be 1%.

Further, the percentage removal of foreign particles and the number of foreign particles adhered were determined in the same manner as in Example 1.

In Tables 1 and 2 are shown the results obtained in the Examples and Comparative Examples.

The results given in Tables 1 and 2 show that the pressure-sensitive adhesive tapes of Examples 1 to 4 according to the present invention each was capable of removing the foreign matter adherent to the front and back sides of a silicon wafer to a high degree with a percentage removal of about 90%, without posing the problem of wafer contamination by a pressure-sensitive adhesive. In particular, the results show that the pressure-sensitive adhesive tape of Example 4, which had undergone an antistatic treatment, was free from the re-adhesion of suspended particles because of the nonoccurrence of static buildup upon tape stripping and hence attained the highest percentage removal.

In contrast, the pressure-sensitive adhesive tape of Comparative Example 1, in which the pressure-sensitive adhesive had a modulus of elasticity after curing of below 1 kg/mm$^2$ and a degree of volumetric shrinkage of 1%, had a low percentage removal of foreign particles because the pressure-sensitive adhesive cured insufficiently. In addition, because of the insufficient cohesive force of the pressure-sensitive adhesive, the pressure-sensitive adhesive layer partly broke upon stripping to contaminate the wafer.

The pressure-sensitive adhesive tape of Comparative Example 2, in which the pressure-sensitive adhesive had a modulus of elasticity before curing of not lower than 1 kg/mm$^2$, had a low percentage removal of foreign particles because the pressure-sensitive adhesive showed insufficient plastic deformation at the time of tape application and was unable to come into close contact with the foreign particles.

The pressure-sensitive adhesive tape of Comparative Example 3, in which the pressure-sensitive adhesive had a degree of volumetric shrinkage through curing of below 2% although the moduli of elasticity thereof before and after curing were below 1 kg/mm$^2$ and not lower than 1 kg/mm$^2$, respectively, had a low percentage removal of foreign particles because the pressure-sensitive adhesive was incapable of sufficiently holding the foreign particles due to the insufficient volumetric shrinkage thereof.

Each of the methods for foreign-matter removal shown in the Examples and Comparative Examples given above was used in a given semiconductor wafer production process to determine the yield of the finally obtained semiconductor device. As a result, it was found that the methods of Examples 1 to 4 attained yields higher by 4 to 16% than those attained with the methods of Comparative Examples 1 to 3. When compared with a conventional wet cleaning method, the yields attained with the methods of the Examples were higher by 12 to 20%.

TABLE 1

| | | Cleaning Test | | | Adhesive Contamination |
|---|---|---|---|---|---|
| | | Number of Foreign Particles | | Percentage Removal of Foreign | Test Number of Foreign |
| | Front or Back of Wafer | Before Cleaning | After Cleaning | Particles (%) | Particles Adhered |
| Example 1 | front | 306 | 30 | 90.2 | 2 |
| | back | 7759 | 463 | 94.0 | |
| Example 2 | front | 255 | 30 | 88.2 | 3 |
| | back | 8001 | 806 | 89.9 | |
| Example 3 | front | 321 | 39 | 87.9 | 5 |
| | back | 6847 | 820 | 88.0 | |
| Example 4 | front | 300 | 13 | 95.7 | 2 |
| | back | 7071 | 290 | 95.9 | |

TABLE 2

| | | Cleaning Test | | | Adhesive Contamination |
|---|---|---|---|---|---|
| | | Number of Foreign Particles | | Percentage Removal of Foreign | Test Number of Foreign |
| | Front or Back of Wafer | Before Cleaning | After Cleaning | Particles (%) | Particles Adhered |
| Comparative Example 1 | front | 421 | 378 | 10.2 | 616 |
| | back | 8914 | 8208 | 7.9 | |
| Comparative Example 2 | front | 356 | 245 | 31.2 | 3 |
| | back | 7601 | 5320 | 30.0 | |
| Comparative Example 3 | front | 333 | 214 | 35.7 | 10 |
| | back | 8459 | 5070 | 40.1 | |

While the invention has been described in detail and with reference to specific embodiments thereof, it will be apparent to one skilled in the art that various changes and modifications can be made therein without departing from the spirit and scope thereof.

What is claimed is:

1. A method for foreign-matter removal which comprises applying a pressure-sensitive adhesive or pressure-sensitive adhesive tape comprising a substrate having a pressure-sensitive adhesive thereon to an article having a foreign matter thereon and then stripping the pressure-sensitive adhesive or pressure-sensitive adhesive tape, to thereby bond and fix the foreign matter to the surface of the pressure-sensitive adhesive and remove the same from the surface of the article, said pressure-sensitive adhesive having the property of curing with an actinic energy source to have a three-dimensional network molecular structure, having a modulus of elasticity (as measured in accordance with JIS K 7127) before the curing of lower than 1 kg/mm$^2$ and a modulus of elasticity after the curing of 1 kg/mm$^2$ or higher, and having a degree of volumetric shrinkage through the curing of 2% or higher;

wherein the substrate of the pressure-sensitive adhesive tape is one subjected to an antistatic treatment and having a surface resistivity of the treated surface (as measured in accordance with ASTM D257) of $1 \times 10^{12}$ ($\Omega$/square) or lower.

2. The method for foreign-matter removal of claim 1, which is used for an article having a foreign matter thereon in a process for producing a precision electronic part.

3. The method for foreign-matter removal of claim 1, wherein said method for foreign-matter removal is used for an article having a foreign matter thereon in a process for producing a precision electronic part; and wherein said precision electronic part is a semiconductor wafer.

4. A method for foreign-matter removal which comprises applying a pressure-sensitive adhesive or pressure-sensitive adhesive tape comprising a substrate having a pressure-sensitive adhesive thereon to an article having a foreign matter thereon and then stripping the pressure-sensitive adhesive or pressure-sensitive adhesive tape, to thereby bond and fix the foreign matter to the surface of the pressure-sensitive adhesive and remove the same from the surface of the article, said pressure-sensitive adhesive having the property of curing with an actinic energy source to have a three-dimensional network molecular structure, having a modulus of elasticity (as measured in accordance with JIS K 7127) before the curing of lower than 1 kg/mm$^2$ and a modulus of elasticity after the curing of 1 kg/mm$^2$ or higher, and having a degree of volumetric shrinkage through the curing of 2% or higher;

wherein said method for foreign-matter removal is used for an article having a foreign matter thereon in a process for producing a precision electronic part; and wherein said precision electronic part is selected from the group consisting of liquid crystal display panels, plasma display panels, hard disks, optical disks, magnetic heads and optical parts/lenses.

5. The method for foreign-matter removal of claim 4, wherein the substrate of the pressure-sensitive adhesive tape is one subjected to an antistatic treatment and having a surface resistivity of the treated surface (as measured in accordance with ASTM D257) of $1 \times 10^{12}$ ($\Omega$/square) or lower.

6. A method for foreign-matter removal which comprises applying a pressure-sensitive adhesive or pressure-sensitive adhesive tape comprising a substrate having a pressure-sensitive adhesive thereon to an article having a foreign matter thereon and then stripping the pressure-sensitive adhesive or pressure-sensitive adhesive tape, to thereby bond and fix the foreign matter to the surface of the pressure-sensitive adhesive and remove the same from the surface of the article, said pressure-sensitive adhesive having the property of curing with an actinic energy source to have a three-dimensional network molecular structure, having a modulus of elasticity (as measured in accordance with JIS K 7127) before the curing of lower than 1 kg/mm$^2$ and a modulus of elasticity after the curing of 1 kg/mm$^2$ or higher, and having a degree of volumetric shrinkage through the curing of 2% or higher;

wherein said method for foreign-matter removal is used for an article having a foreign matter thereon in a process for producing a precision electronic part; and wherein said precision electronic part is a semiconductor wafer.

* * * * *